(12) United States Patent
Nowak et al.

(10) Patent No.: US 7,505,337 B2
(45) Date of Patent: *Mar. 17, 2009

(54) METHOD AND APPARATUS FOR REPAIRING A SHORTED TUNNEL DEVICE

(75) Inventors: Janusz Jozef Nowak, Highland Mills, NY (US); Mark Curtis Hayes Lamorey, South Burlington, VT (US); Yu Lu, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 279 days.

This patent is subject to a terminal disclaimer.

(21) Appl. No.: 11/330,493

(22) Filed: Jan. 12, 2006

(65) Prior Publication Data

US 2007/0171736 A1    Jul. 26, 2007

(51) Int. Cl.
*G11C 29/00* (2006.01)

(52) U.S. Cl. .................. 365/200; 365/158; 365/185.02

(58) Field of Classification Search ............. 365/185.02
See application file for complete search history.

(56) References Cited

U.S. PATENT DOCUMENTS 6,128,241 A * 10/2000 Choi ........................ 365/225.7
7,260,004 B2 * 8/2007 Lamorey et al. ............. 365/201

* cited by examiner

*Primary Examiner*—Tan T. Nguyen
(74) *Attorney, Agent, or Firm*—Ido Tuchman; Ryan, Mason & Lewis, LLP

(57) ABSTRACT

A method for repairing a shorted tunnel device includes the step of applying a stressing signal to the tunnel device. The stressing signal has an amplitude that is greater than an amplitude of a bias signal applied to the device during normal operation. One or more characteristics of the stressing signal are selected so as to substantially optimize a repair of the device. The amplitude and/or the duration of the stressing signal are preferably selected so as to remove a conductive filament shorting the device via a thermal mechanism (e.g., heating).

20 Claims, 2 Drawing Sheets

METHOD AND APPARATUS FOR REPAIRING A SHORTED TUNNEL DEVICE

FIELD OF THE INVENTION

The present invention relates generally to semiconductor devices, and more particularly relates to techniques for repairing a shorted tunnel device.

BACKGROUND OF THE INVENTION

Magnetic tunnel junction (MTJ) devices are employed in a wide variety of applications, such as, for example, as storage cells in a magnetic random access memory (MRAM). As storage density requirements continue to increase, the design of MRAM circuit architectures to meet such requirements becomes significantly more challenging. Furthermore, with greater storage density comes a higher likelihood that one or more memory cells (i.e., bits) in the MRAM will be defective (e.g., shorted). A primary cause of reduced yield in MRAM is attributable to shorted memory cells. Thus, while it would be desirable to achieve one hundred percent yield of working devices, such a yield is generally not attainable in a high-density memory device without significant cost.

Conventionally, MRAM is often designed with a certain amount of built-in redundancy, so that defective memory cells, at final test, can be identified, readdressed and essentially replaced by memory cells residing in a redundancy area of the device. While this approach has had some success at improving yield, the additional chip area required in order to incorporate such redundancy in the MRAM device comes at the price of significantly lower storage density in the device and is therefore undesirable. Moreover, due to the ever-increasing storage capacity of MRAM, the number of defects is becoming so large that the redundancy methodology is no longer a viable solution.

Accordingly, there exists a need for techniques capable of providing enhanced yield in a memory circuit, as well as other circuits employing MTJ devices, that do not suffer from one or more of the problems exhibited by conventional memory architectures and methodologies.

SUMMARY OF THE INVENTION

The present invention meets the above-noted need by providing, in an illustrative embodiment, techniques for advantageously repairing shorted tunnel devices formed in an integrated circuit. The techniques of the invention can therefore be used for improving the yield of memory circuits, or alternative circuits, employing such tunnel devices (e.g., MTJ devices, spin valves, tunnel diodes, etc.). In the case of a memory circuit application (e.g., MRAM), the tunnel device repair methodology of the present invention can be used to improve yield without significantly increasing a chip area required by the memory circuit.

In accordance with one aspect of the invention, a method for repairing a shorted tunnel device includes the step of applying a stressing signal to the tunnel device. The stressing signal has an amplitude that is greater than an amplitude of a bias signal applied to the device during normal operation. One or more characteristics of the stressing signal are selected so as to substantially optimize a repair of the device. The amplitude and/or the duration of the stressing signal are preferably selected so as to remove a conductive filament shorting the tunnel device via a thermal mechanism (e.g., heating).

These and other features and advantages of the present invention will become apparent from the following detailed description of illustrative embodiments thereof, which is to be read in connection with the accompanying drawings.

DETAILED DESCRIPTION OF THE INVENTION

The present invention will be described herein in the context of an illustrative MTJ device, which may be employed as a storage element in a MRAM or alternative memory circuit. It should be understood, however, that the present invention is not limited to MRAM applications. Rather, the invention is more generally applicable to techniques for advantageously repairing shorted tunnel devices formed in an integrated circuit. The techniques of the invention can therefore be used for improving the yield of memory circuits, or alternative circuits, employing such tunnel devices (e.g., MTJ devices, spin valves, tunnel diodes, etc.). In the case of a memory circuit application (e.g., MRAM), the tunnel device repair methodology of the present invention can be used to improve yield without significantly increasing a chip area required by the memory circuit.

Although the present invention may be described herein with specific reference to MRAM, the techniques of the invention may be similarly applicable to alternative memory architectures including, but not limited to, phase change memory (PCM) or other memory architectures utilizing storage cells having tunnel barriers. Moreover, while the methodologies of the invention may beneficially eliminate the need for a redundancy area in a memory device, or at least substantially reduce the amount of redundancy area required, the techniques of the invention may be similarly employed in a memory device comprising a redundancy area, particularly in a memory device wherein the redundancy area is too small to effectively accommodate the number of defective bits therein.

Figure 1:
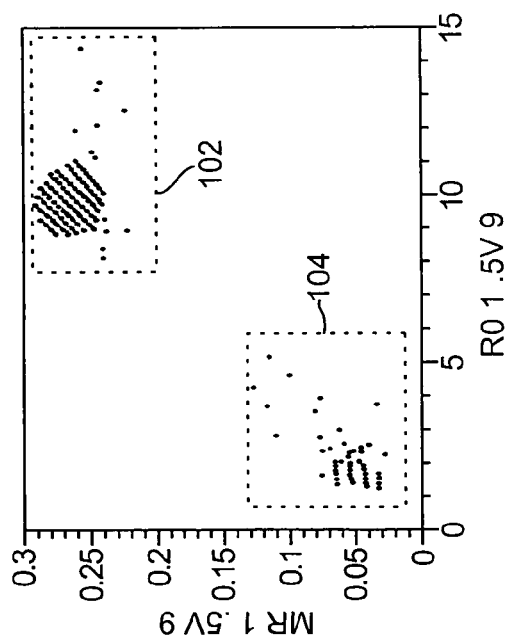
FIG. 1 is a graph depicting exemplary test measurements for a standard 128Kb MRAM chip, wherein functioning memory cells and defective memory cells are represented by separate groups of data points based in part on a measured resistance and magnetoresistance of each of the memory cells, in accordance with one aspect of the invention.

As previously stated, a large number of failures in a memory circuit are attributable to shorted memory cells. By way of example only, in experimental testing the types of defects in 128 kilobyte (Kb) MRAM wafers were identified and more than ninety percent of the defective devices were found to be attributable to shorted MTJ devices. Any reduction in the number of shorted MTJ devices will have a large impact on the overall MRAM yield. A functioning MTJ device typically exhibits a resistance, R0, above about 10 kilo (K) ohms and a magnetoresistance, MR, above about 25 percent. In contrast, a shorted MTJ device typically exhibits a resistance below about 5K ohms, more particularly, between about 1.5K and 5K ohms, and a magnetoresistance below about 15 percent. Thus, a defective MTJ device can be easily detected by measuring a resistance and/or magnetoresistance of the device. FIG. 1 is a graph depicting exemplary test measurements for a standard 128Kb MRAM chip, wherein functioning memory cells are represented by data points 102 and defective memory cells are represented by data points 104.

In a memory circuit employing tunnel devices as storage elements, each memory cell is typically composed of two outside layers separated by a very thin (e.g., about 10 to 20 angstroms thick) nonmagnetic spacer or tunneling barrier. In the case of a standard MTJ device, the two outside layers are magnetic layers (e.g., a pinned layer and a free layer). During the fabrication of such tunnel devices, a small conductive (e.g., metallic) filament sometimes forms between the two outside layers. The conductive filament may be present inside a junction area of the tunnel device and is typically referred to as a pinhole. Alternatively, or in addition, the filament may be present at a junction periphery (e.g., between the tunneling barrier and the two outside layers) in the tunnel device, resulting at least in part from metal redeposition at the device walls during an etch process used to form electrodes for electrically contacting the two outside layers of the device. In either case, the filament, being highly conductive, effectively shorts the tunneling-based storage element.

In accordance with one aspect of the invention, a defective tunneling-based storage device can be advantageously repaired by effectively removing the conductive filament shorting the device. To accomplish this, an external stressing signal (e.g., a voltage and/or a current) of sufficient magnitude and duration is preferably applied to a shorted tunnel device, also referred to herein synonymously as a shorted bit, in order to repair the device. When the stressing signal is applied to the device, current is concentrated in the small conductive filament shorting the device. As a result, the filament heats up, is oxidized and is mixed with surrounding oxide in the device (e.g., silicon dioxide, etc.). In some cases, such as, for example, when the stressing signal comprises a relatively short (e.g., less than about one microsecond) and large voltage (e.g., greater than about one volt) pulse, the conductive filament may blow (e.g., a nanoscale explosion), in a manner consistent with the blowing of a fuse. In either scenario, the short is effectively removed and electron tunneling becomes the dominant transport mechanism, as is characteristic of a functioning device. Thus, the invention beneficially utilizes a thermal mechanism for repairing a shorted tunnel device.

Since the mechanism for repairing the shorted tunnel device is primarily thermal in nature, the ultimate success of the repair methodology of the present invention is dependent, to a large degree, on the thickness and/or localization of the conductive filament shorting the tunnel device. The type of defect associated with a given tunnel device can be classified into at least two types, namely, "heavily shorted" and "lightly shorted," a heavily shorted tunnel device being characterized by a conductive filament which is thicker compared to a lightly shorted device. The thicker the conductive filament is, the more heat it will take to melt and remove the short, and thus the less likely it will be to repair the tunnel device in the manner described herein. The type of short in the tunnel device can be easily determined, in at least one respect, by measuring a resistance and/or magnetoresistance of the defective device. Heavily shorted tunnel devices may be characterized as those devices having a resistance of less than about 2K ohms, more particularly about 1K to 2K ohms, and a magnetoresistance of less than about 5 percent. Lightly shorted devices, on the other hand, may be characterized as those devices having a resistance above about 2K ohms, more particularly about 3K to 5K ohms, and a magnetoresistance of about 5 to 15 percent. Experimental results indicate that a tunnel device with a measured resistance above about 5K ohms has a repair success close to about 100 percent using the methodologies of the present invention.

One or more stressing signal parameters are preferably selected, in accordance with the invention, to optimize a repair of the shorted tunnel device. Two important parameters of the stressing signal which affect the repair methodology to a large extent are signal amplitude and signal duration. The repair yield is, to at least some extent, sensitive to filament localization and/or the type of materials used in forming the barrier and electrodes of the device, among other device characteristics, and therefore the amplitude and duration of the stressing signal necessary to repair a shorted tunnel device may be somewhat specific to the semiconductor fabrication process used to form the tunnel device.

The amplitude of the stressing signal is preferably selected to be below a breakdown voltage, BV, of the barrier layer in the tunnel device. Alternatively, if the amplitude of the stressing signal is too low, no repair of the shorted tunnel device will occur. If the amplitude of the stressing signal is greater than or equal to the breakdown voltage of the tunnel device, the device can become damaged during the repair process, which is undesirable. Barrier breakdown in a tunnel device generally occurs when the electric field intensity in the barrier layer is too high (e.g., greater than about 10 megavolts per centimeter). The electric field intensity, E, in the barrier layer is a function of the voltage, V, across the barrier divided by the thickness, d, of the barrier (E =V/d). Thus, as the barrier thickness d of the tunnel device is decreased, the voltage V at which barrier breakdown occurs will decrease accordingly so as not to exceed a maximum electric field intensity E in the device. Also, as an operating temperature of the tunnel device increases (e.g., above about 500 degrees Celsius), breakdown voltage of the barrier layer in the device typically decreases. By way of example only, the breakdown voltage of the barrier layer in a typical MTJ device is about 1.5 volts, for a barrier layer thickness of about 10 to 20 angstroms and an operating temperature of about±50 degrees Celsius.

It is to be appreciated that the actual voltage present across the barrier layer in the device will generally be smaller than the voltage applied across the electrodes of the tunnel device. This due, at least in part, to the presence of one or more voltage drops in the device resulting primarily from parasitic resistance in the device. For example, there may be resistance attributable to each of the electrodes providing electrical connection to the device and/or resistance attributable to a junction between the respective electrodes and the corresponding outside layers forming the device. Consequently, the amplitude of the voltage applied to the electrodes of the tunnel device should be selected such that the actual voltage appearing across the barrier in the device is less than the breakdown voltage of the barrier layer in the device but greater than a certain minimum voltage level necessary to affect a repair of the shorted device. The amplitude of the stressing signal, therefore, will be dependent to at least some extent on the overall resistance of the tunnel device itself, which includes parasitic resistance in the device.

In a preferred embodiment of the invention, the amplitude of the stressing signal is selected to be greater than an amplitude of a bias signal applied to the tunnel device during normal operation of the device and less than the breakdown voltage of the barrier layer in the device. In an illustrative MRAM application, during normal operation of the MRAM, the actual bias across the barrier layer of a tunnel device employed in the MRAM is, for example, about 200 millivolts (mV) to about 250 mV.

By way of example only, for an illustrative MTJ device having a resistance of about 11K ohms, and therefore not shorted, a voltage amplitude of about 1.5 volts applied across the electrodes of the MTJ device will correspond to an actual voltage of about 800 mV across the barrier junction. If the resistance of the MTJ device is about 4K ohms, thereby indicating a short, then for a signal of about 1.5 volts applied across the device, the actual voltage appearing across the barrier layer will be about 670 mV. Once the device is repaired and the short is removed, the resistance will jump to about 10K ohms and the voltage across the barrier junction will increase to about 800 mV. In either case, assuming an applied voltage of about 1.5 volts, an estimated stressing signal at the barrier layer of a shorted tunnel device (e.g., having a resistance of about 4K ohms) will be about 670 mV and the estimated voltage at the barrier layer of a repaired device (e.g., having a resistance of greater than about 10K ohms) will be about 800 mV, both of which are substantially smaller than a typical barrier breakdown voltage of the device (e.g., about 1.6 volts). Thus, using this illustrative repair methodology, devices, once repaired, are not likely to be damaged again by the repair process.

As previously stated, the duration of the stressing signal applied to the tunnel device is also an important parameter in optimizing the repair methodology of the present invention. The mechanism for repairing shorted devices is at least partially dynamic in nature. This conclusion is based primarily on numerous experimental data showing a significantly higher repair yield using a stressing signal of relatively short duration (e.g., less than about one microsecond) compared to longer duration stressing signal pulses (e.g., about one millisecond to about 100 milliseconds). In fact, in some instances, long duration stressing signal pulses (e.g., 100 milliseconds) exacerbated the damage to the already shorted devices.

Preferably, the duration of the stressing signal is selected to be long enough to allow the conductive filament shorting the tunnel device to heat up to thereby remove the short. In some instances, the duration of the applied stressing signal may be so short that the heat generated in the filament is not enough to remove it. Thus, the optimal duration of the stressing signal will be dependent, to at least some extent, on the type of materials forming and surrounding the conductive filament. A plurality (e.g., about 20 to 30) of relatively short duration (e.g., less than about one microsecond) stressing signal pulses may be employed to repair the shorted tunnel device. Preferably, the duration between successive pulses is selected so as to prevent the heat generated in the conductive filament from fully dissipating before the start of the next stressing signal pulse, otherwise the temperature of the filament will fail to reach a higher enough level to eliminate the short. The optimal duration of time between successive pulses of the stressing signal will be a function of the type material forming the filament and the thickness of the filament, among other characteristics.

It is to be understood that rise time and/or fall time of the stressing signal may also have some impact on the repair yield of the methodology of the present invention. Faster rise and fall times have generally been determined to increase the repair yield and are therefore preferred, although the effective rise and fall times appearing across the barrier layer in the tunnel device will typically be limited as a function of one or more characteristics of the device itself, including, for example, parasitic capacitance of the device. Rise and/or fall times of the stressing signal appearing at the barrier layer of the tunnel device may be limited, to a large extent, by parasitic capacitance in the device. Parasitic capacitance essentially acts as a low pass filter to prevent the voltage appearing at the barrier layer of the device from changing too rapidly. For example, for a shorted tunnel device having a resistance of about 4K ohms, a parasitic capacitance of a few femtofarads (fF) will effectively limit the rise and fall times of the stressing signal appearing across the barrier layer in the device to about 50 picoseconds (ps). Thus, a stressing signal having rise and fall times faster than this limit will provide no additional benefit to the repair yield.

Figure 2A:
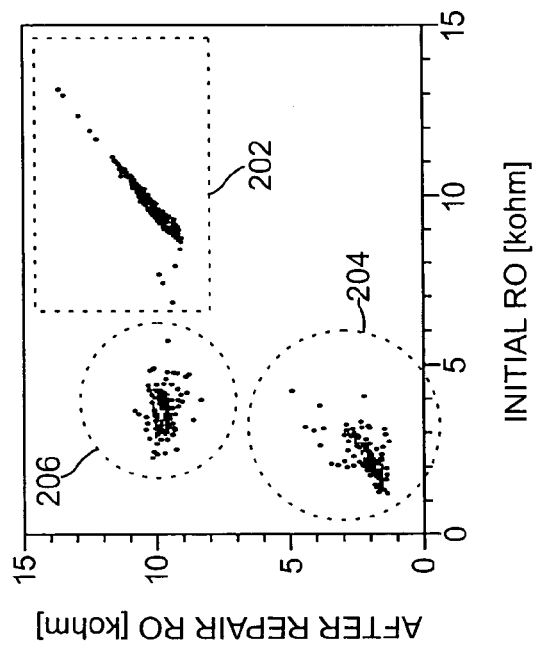
FIG. 2A is a graph depicting exemplary test measurements for a standard 128Kb MRAM chip, wherein functioning memory cells, repaired memory cells and heavily shorted memory cells are represented by separate groups of data points based on a measured resistance of each of the memory cells before and after a repair process has been performed, in accordance with an embodiment of the invention.
Figure 2B:
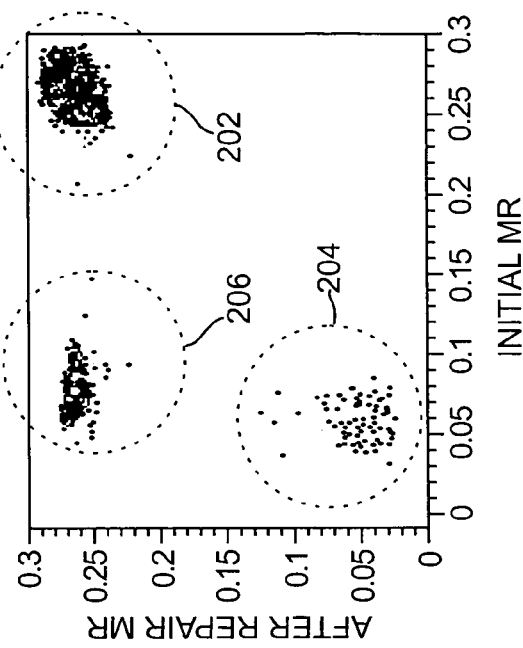
FIG. 2B is a graph depicting exemplary test measurements for the standard 128Kb MRAM chip shown in FIG. 2A, wherein functioning memory cells, repaired memory cells and heavily shorted memory cells are represented by separate groups of data points based on a measured magnetoresistance of each of the memory cells before and after a repair process has been performed, in accordance with an embodiment of the invention.

By way of example only, and without loss of generality, a repair of an illustrative 128Kb memory array employing MTJ storage elements was performed, in accordance with an illustrative embodiment of the invention. With reference to FIGS. 2A and 2B, 147 devices of the 131,072 (128Kb) total devices in the memory array were determined to be shorted (e.g., having a resistance of less than about 8K ohms and a magnetoresistance of less than about 15 percent), with the remaining 130,925 devices, represented collectively as cluster 202, being functioning devices. Of the 147 shorted devices, 72 devices (about half) were determined to be heavily shorted (e.g., having a resistance of less than about 2K ohms and a magnetoresistance of less than about 5 percent), and therefore not repairable. As apparent from FIGS. 2A and 2B, these devices, represented collectively as cluster 204, had measured resistances (see FIG. 2A) and/or magnetoresistances (see FIG. 2B) which remained essentially unchanged after the repair process when compared to their respective resistances and magnetoresistances prior to initiating the repair process. Alternatively, 75 devices were determined to be lightly shorted (e.g., each having a resistance of about 2K ohms to about 5K ohms), and therefore repairable. These repairable devices, represented collectively as cluster 206, had measured resistances (see FIG. 2A) and magnetoresistances (see FIG. 2B) which, when compared to their respective resistances and magnetoresistance prior to initiating the repair process, substantially increased after the repair process to a range indicative of a functioning tunnel device. After applying a stressing signal comprising thirty 0.5 microsecond pulses, virtually 100 percent of devices 206 were repaired.

Figure 3:
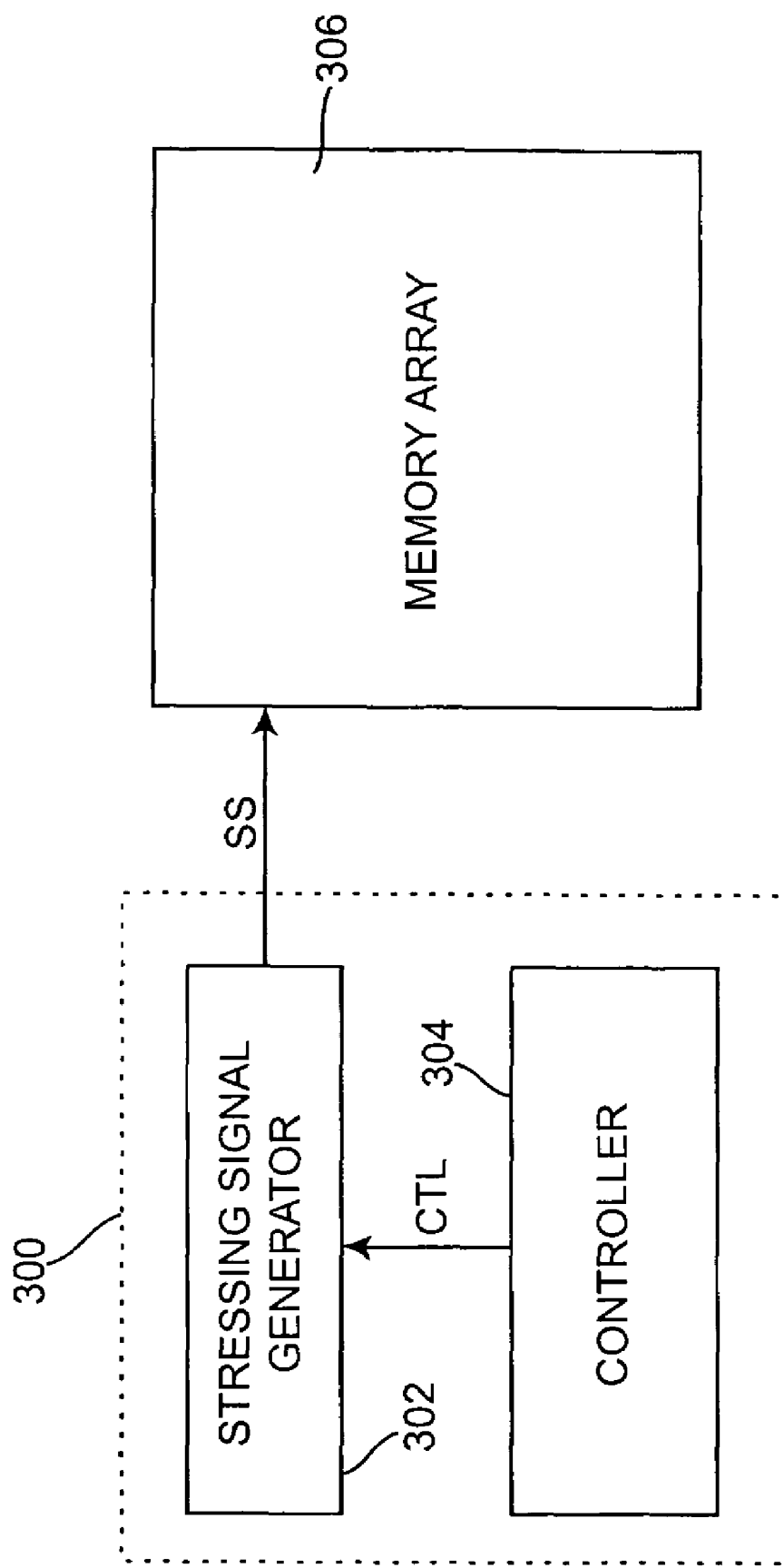
FIG. 3 is a block diagram depicting an exemplary repair circuit for repairing shorted tunnel devices, in accordance with one aspect of the invention.

FIG. 3 is a block diagram depicting an exemplary repair circuit 300 for repairing shorted tunnel devices, in accordance with one aspect of the invention. The repair circuit 300 preferably includes a stressing signal generator circuit 302 for supplying a stressing signal, SS, necessary to repair the shorted tunnel device(s). The stressing signal may be in the form of either a voltage or a current, in which case the stressing signal generator 302 may comprise a voltage source or a current source, respectively. One or more characteristics (e.g., amplitude, duration, etc.) of the stressing signal SS is preferably controlled as a function of a control signal, CTL, which may be generated by a controller 304 included in the repair circuit 300. The controller 304, or alternatively other circuitry included in the repair circuit 300, is preferably operative to detect whether or not a given tunnel device is shorted prior to initiating a repair of the device. As apparent from the figure, the stressing signal SS may be used to repair one or more tunnel devices included in a memory array 306, although the invention is not limited to memory applications, as previously stated.

The repair methodology of the present invention can be advantageously performed at a wafer testing level using, for example, a wafer test program and associated testing hardware (e.g., wafer prober, etc.). Moreover, the repair methodology of the present invention can be performed during post fabrication, such as, for example, during pre-package or post-package testing. This is especially beneficial for repairing devices that may have failed either during packaging or during normal use.

At least a portion of the methodologies of the present invention may be implemented in an integrated circuit. In forming integrated circuits, a plurality of identical die is typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Integrated circuits so manufactured are considered part of this invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A method for repairing a shorted tunnel device, the method comprising the step of applying a stressing signal to the tunnel device, the stressing signal having an amplitude that is greater than an amplitude of a bias signal applied to the device during normal operation, at least one characteristic of the stressing signal being selected so as to remove a conductive filament shorting the device.

2. The method of claim 1, wherein the amplitude of the stressing signal is selected to be less than a breakdown voltage of a barrier layer in the tunnel device.

3. The method of claim 1, wherein application of the stressing signal to the device causes the conductive filament shorting the device to heat up and oxidize thereby creating an open circuit in the conductive filament.

4. The method of claim 1, wherein the at least one characteristic of the stressing signal comprises at least one of an amplitude and a duration of the stressing signal.

5. The method of claim 4, wherein at least one of the amplitude and the duration of the stressing signal is selected so as to remove the conductive filament shorting the device via a thermal mechanism.

6. The method of claim 5, wherein at least one of the amplitude and the duration of the stressing signal is selected as a function of at least one of a thickness of the conductive filament, a type of material of the conductive filament and a location of the conductive filament in the tunnel device.

7. The method of claim 5, wherein at least one of the amplitude and the duration of the stressing signal is selected as a function of at least one of a type of material surrounding the conductive filament and a thickness of the conductive filament.

8. The method of claim 1, wherein the amplitude of the stressing signal is selected to be above a minimum threshold level necessary to repair the tunnel device and below a breakdown voltage of a barrier layer in the device.

9. The method of claim 1, wherein the stressing signal comprises a plurality of pulses, a duration between any two successive pulses being less than a heat dissipation time of the conductive filament shorting the tunnel device.

10. The method of claim 1, wherein the tunnel device comprises a magnetic tunnel junction device.

11. The method of claim 1, wherein the amplitude of the stressing signal is in a range from about 600 millivolts to about 1.5 volts.

12. Apparatus for repairing a shorted tunnel device, the apparatus comprising:
a signal generator operative: (i) to generate a stressing signal having an amplitude that is greater than an amplitude of a bias signal applied to the device during normal operation; and (ii) to apply the stressing signal to the shorted tunnel device for initiating a repair of the device; and
a controller coupled to the signal generator, the controller being operative to control one or more characteristics of the stressing signal so as to remove a conductive filament shorting the tunnel device.

13. The apparatus of claim 12, wherein the one or more characteristics of the stressing signal includes at least one of an amplitude and a duration of the stressing signal.

14. The apparatus of claim 12, wherein the controller is further operative to detect whether or not a given tunnel device is shorted prior to initiating a repair of the device.

15. The apparatus of claim 12, wherein the controller is operative to control an amplitude of the stressing signal, the amplitude of the stressing signal being selected to be less than a breakdown voltage of a barrier layer in the tunnel device.

16. The apparatus of claim 15, wherein the amplitude of the stressing signal is in a range from about 600 millivolts to about 1.5 volts.

17. The apparatus of claim 12, wherein the one or more characteristics of the stressing signal is selected as a function of at least one of a thickness of the conductive filament shorting the tunnel device, a type of material of the conductive filament and a location of the conductive filament in the tunnel device.

18. The apparatus of claim 12, wherein the stressing signal comprises a plurality of pulses, a duration between any two successive pulses being less than a heat dissipation time of the conductive filament shorting the tunnel device.

19. The apparatus of claim 12, wherein application of the stressing signal to the tunnel device causes the conductive filament shorting the device to heat up and oxidize, thereby creating an open circuit in the conductive filament.

20. The apparatus of claim 12, wherein the tunnel device comprises a magnetic tunnel junction device.

* * * * *